United States Patent
Yoon et al.

(10) Patent No.: US 11,190,156 B2
(45) Date of Patent: Nov. 30, 2021

(54) APPARATUS INCLUDING ELECTRONIC CIRCUIT FOR CONTROLLING GAIN OF SIGNAL

(71) Applicant: Samsung Electronics Co., Ltd., Suwon-si (KR)

(72) Inventors: Youngchang Yoon, Suwon-si (KR); Donggyu Minn, Suwon-si (KR); Kyuhwan An, Suwon-si (KR); Sangho Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/740,157

(22) Filed: Jan. 10, 2020

(65) Prior Publication Data

US 2020/0228080 A1    Jul. 16, 2020

(30) Foreign Application Priority Data

Jan. 10, 2019  (KR) ................ 10-2019-0003462

(51) Int. Cl.
*G05F 1/00* (2006.01)
*H03G 3/30* (2006.01)
*H03H 11/28* (2006.01)

(52) U.S. Cl.
CPC .......... *H03G 3/3036* (2013.01); *H03H 11/28* (2013.01); *H03G 2201/106* (2013.01); *H03G 2201/307* (2013.01)

(58) Field of Classification Search
CPC .......... H03G 3/3036; H03G 2201/106; H03G 2201/307; H03H 11/28

USPC .......................................................... 327/520
See application file for complete search history.

(56) References Cited

U.S. PATENT DOCUMENTS

| | | |
|---|---|---|
| 5,049,841 A | 9/1991 | Cooper et al. |
| 6,414,565 B1 | 7/2002 | Tanaka et al. |
| 7,205,817 B1 * | 4/2007 | Huang ................ H03H 11/245 327/308 |
| 9,729,190 B2 * | 8/2017 | Yehezkely ............ H03H 7/465 |
| 2004/0239440 A1 | 12/2004 | Nyberg |
| 2012/0135698 A1 | 5/2012 | Yan et al. |
| 2012/0319755 A1 * | 12/2012 | Zhang ................. H03H 11/245 327/308 |
| 2013/0113575 A1 * | 5/2013 | Easter ..................... H03H 7/24 333/103 |
| 2016/0274246 A1 * | 9/2016 | Kimura ..................... G01T 1/17 |
| 2017/0033770 A1 | 2/2017 | Jordan |

(Continued)

OTHER PUBLICATIONS

Uwe Mayer et al., "An Automatically Matched CMOS Attenuator at C-Band with Improved Control Linearity", IEEE International Conference on Microwaves, Communications, Antennas and Electronics Systems, Nov. 9-11, 2009, 4 pages.

(Continued)

*Primary Examiner* — Metasebia T Retebo

(57) ABSTRACT

An apparatus including an electronic circuit. The apparatus includes a path unit configured to form a first impedance for controlling a gain of an input signal. The apparatus also includes a shunt unit configured to form a second impedance for performing attenuation between the path unit and a ground, wherein the path unit forms the first impedance using an on-resistance of at least one transistor.

9 Claims, 23 Drawing Sheets

(56) References Cited

U.S. PATENT DOCUMENTS

2017/0104471 A1    4/2017   Shrivastava
2018/0175828 A1*   6/2018   Othman ................ H03H 11/30

OTHER PUBLICATIONS

Partial European Search Report dated Jun. 9, 2020 in connection with European Patent Application No. 20 15 1231, 17 pages.
Jeon et al., "Linear Voltage Controlled Variable Resistor Using Body Potential in SOI process", IEEE Microwave and Wireless Components Letters, vol. 26, No. 10, Oct. 2016, 3 pages.
Schmiedeke et al., "A fully integrated high IP1dB CMOS SPDT switch using stacked transistors for 2.4 GHz TDD transceiver applications", Indian Academy of Sciences, Jun. 2018, 7 pages.
Hangai et al., "A Low Phase-Shift Temperature Compensation Attenuator with Variable-Q FET Resonators", 2008 IEEE, 4 pages.
European Search Report dated Oct. 14, 2020 in connection with European Patent Application No. 20 15 1231, 23 pages.

* cited by examiner

APPARATUS INCLUDING ELECTRONIC CIRCUIT FOR CONTROLLING GAIN OF SIGNAL

CROSS-REFERENCE TO RELATED APPLICATIONS

This application is based on and claims priority under 35 U.S.C. § 119 to Korean Patent Application No. 10-2019-0003462 filed on Jan. 10, 2019, in the Korean Intellectual Property Office, the disclosure of which is incorporated by reference herein in its entirety.

BACKGROUND

1. Field

The disclosure relates to an electronic circuit, and more particularly, to an apparatus containing an electronic circuit for controlling the gain of a signal.

2. Description of Related Art

In various electronic circuits that process radio frequencies (RF), the gain of a signal needs to be controlled for various purposes. For example, a device that performs communication may need to control a gain in order to perform effective signal processing in the device, or for effective signal transmission to the outside.

A circuit that controls the gain of a signal is referred to as an attenuator. According to a detailed circuit design, the attenuator may have a gain control range, and may have limited linearity. As the attenuator has a larger range of gain and a higher linearity, utilization thereof may be improved.

The above information is presented as background information only to assist with an understanding of the disclosure. No determination has been made, and no assertion is made, as to whether any of the above might be applicable as prior art with regard to the disclosure.

SUMMARY

An aspect of the disclosure is to provide an apparatus including an electronic circuit configured to effectively control the gain of a signal.

An aspect of the disclosure is to provide an apparatus including an electronic circuit that implements an attenuator having a wide gain control range and a high linearity.

In accordance with an aspect of the disclosure, an apparatus including an electronic circuit may include: a path unit configured to form a first impedance for controlling a gain of an input signal; and a shunt unit configured to form a second impedance for performing attenuation between the path unit and a ground, and the path unit may form the first impedance using an on-resistance of at least one transistor.

In accordance with an aspect of the disclosure, the apparatus may include an attenuation enabling unit configured to turn on or off a path between the path unit and the shunt unit, and the attenuation enabling unit may turn on the path if the electronic circuit attenuates a gain of the input signal.

In accordance with an aspect of the disclosure, the path unit may include a plurality of paths that form different impedance values, and each of the plurality of paths may include at least one transistor that operates as a switch.

In accordance with an aspect of the disclosure, at least one transistor, which is included in a first path corresponding to a gain variation of the input signal among the plurality of paths, is turned on, and at least one transistor, included in at least one path remaining after excluding the first path from the plurality of paths, is turned off.

In accordance with an aspect of the disclosure, the plurality of paths may include a through path that provides a minimum gain variation, and the through path may include a transistor and an inductor which are connected in parallel.

In accordance with an aspect of the disclosure, at least one path of the plurality of paths may include a plurality of transistors connected in a stack structure.

In accordance with an aspect of the disclosure, the apparatus may further include an input matching unit connected to an input end of the input signal, and the input matching unit may include at least one inductor for performing compensation associated with a parasitic capacitance of the at least one transistor.

In accordance with an aspect of the disclosure, the at least one transistor may be controlled to be a reverse bias state.

According to an apparatus according to various embodiments, an attenuator is implemented using the on-resistance of a transistor, and a small circuit size and a low pressure volume temperature (PVT) variation may be secured.

Effects which can be acquired by the disclosure are not limited to the above described effects, and other effects that have not been mentioned may be clearly understood by those skilled in the art from the following description.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely.

Moreover, various functions described below can be implemented or supported by one or more computer programs, each of which is formed from computer readable program code and embodied in a computer readable medium. The terms "application" and "program" refer to one or more computer programs, software components, sets of instructions, procedures, functions, objects, classes, instances, related data, or a portion thereof adapted for implementation in a suitable computer readable program code. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

FIGS. 1 through 12B, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system or device.

The terms used in the disclosure are only used to describe specific embodiments and are not intended to limit the disclosure. A singular expression may include a plural expression unless they are definitely different in a context. Unless defined otherwise, all terms used herein, including technical and scientific terms, have the same meaning as those commonly understood by a person skilled in the art to which the disclosure pertains. Such terms as those defined in a generally used dictionary may be interpreted to have the meanings equal to the contextual meanings in the relevant field of art and are not to be interpreted to have ideal or excessively formal meanings unless clearly defined in the disclosure. In some cases, even the term defined in the disclosure should not be interpreted to exclude embodiments of the disclosure.

Hereinafter, various embodiments of the disclosure will be described based on an approach of hardware. However, various embodiments of the disclosure include a technology that uses both hardware and software and thus, the various embodiments of the disclosure may not exclude the perspective of software.

Hereinafter, the disclosure relates to an apparatus containing an electronic circuit for controlling the gain of a signal. Particularly, the disclosure relates to implementation of an attenuator, and describes the structure of the circuit of an attenuator which is implemented using the on-resistance of a transistor.

Hereinafter, a term used for indicating a signal, a term used for a material, a term used for a structure, a term used for a shape, or the like are used for ease of description. Therefore, the disclosure is not limited to the terms used in the description, and other terms having the same technical meaning may be used.

Figure 1:
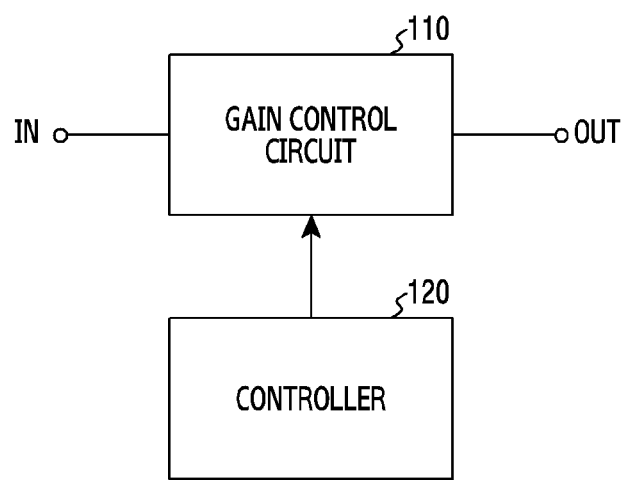
FIG. 1 illustrates a diagram of an electronic circuit for controlling a gain according to various embodiments.

FIG. 1 illustrates a diagram of an electronic circuit for controlling a gain according to various embodiments. Referring to FIG. 1, an electronic circuit includes a gain control circuit 110 and a controller 120.

The gain control circuit 110 may include an input terminal IN and an output terminal OUT, and may control (e.g., increase, decrease, or maintain) the gain of a signal input via the input terminal IN and output the signal of which the gain is controlled via the output terminal OUT. The signal may include a radio frequency (RF) signal.

The controller 120 may control operation of the gain control circuit 110. The controller 120 may determine a variation in gain to be controlled by the gain control circuit 110 according to the magnitude of a required output signal and may generate and output a signal for controlling operation of the gain control circuit 110. According to an embodiment, the controller 120 may convert a desired gain variation value to control signals for directly controlling elements in the gain control circuit 110. To this end, the controller 120 may include at least one of a processor, a micro processor, a micro controller, a memory, and a control signal generation circuit.

Figure 2:
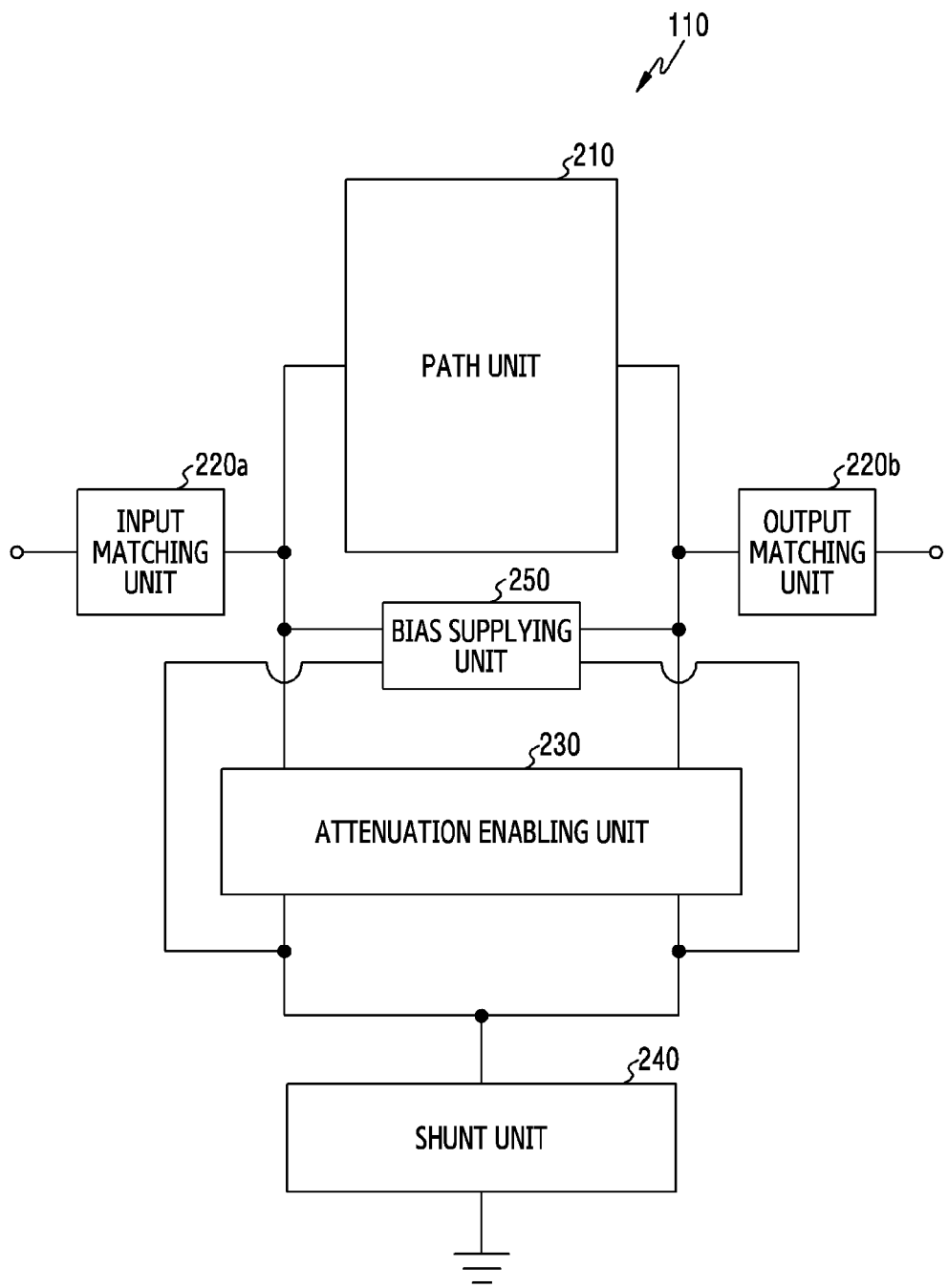
FIG. 2 illustrates a diagram of a configuration of a gain control circuit according to various embodiments.

FIG. 2 illustrates a diagram of a configuration of a gain control circuit according to various embodiments. Referring to FIG. 2, the gain control circuit 110 may include a path unit 210, an input matching unit 220a, an output matching unit 220b, an attenuating enabling unit 230, a shunt unit 240, and a bias supplying unit 250.

The path unit 210 may form an impedance for controlling the gain of a signal. According to various embodiments, the path unit 210 may include at least one element that forms resistance, and at least one element that performs switching. For example, the path unit 210 may include at least one transistor, and may perform switching by controlling a voltage applied to a gate terminal of the transistor, and may form resistance using the on-resistance of the transistor. Here, the on-resistance indicates the resistance of a transistor itself which is determined by the length and the width of the transistor. As the amount of attenuation of the gain of a signal increases, the path unit 210 may form a larger impedance.

The input matching unit 220a may form an input impedance of the gain control circuit 110, and the output matching unit 220b may form an output impedance of the gain control circuit 110. The input matching unit 220a and the output matching unit 220b may form a predetermined magnitude of an input/output impedance (e.g., 50Ω). The input matching unit 220a and the output matching unit 220b may include at least one element (e.g., an inductor or a capacitor) selected on the basis of the characteristic of another element (e.g., the path unit 210 or the like). According to an embodiment, the input matching unit 220a and the output matching unit 220b may be excluded.

The attenuation enabling unit 230 may selectively connect the path unit 210 and the shunt unit 240. If the gain control circuit 110 performs attenuation, the attenuation enabling unit 230 may connect the path unit 210 and the shunt unit 240. Conversely, if the gain control circuit 110 passes a signal without performing attenuation, the attenuation enabling unit 230 may open the path between the path unit 210 and the shunt unit 240. To this end, the attenuation enabling unit 230 may include at least one switch.

The shunt unit 240 may form an impedance and an additional path required when the gain control circuit 110 performs attenuation. According to various embodiments, the shunt unit 240 may include at least one element that forms resistance, and at least one element that performs switching. For example, the path unit 210 may include at least one transistor, and may perform switching by controlling a voltage applied to a gate terminal of the transistor and may form resistance using the on-resistance of the transistor. As the amount of attenuation of the gain of a signal increases, the shunt unit 240 may form a larger impedance.

The bias supplying unit 250 may supply a bias voltage to enable transistors included in at least one of the path unit 210, the attenuation enabling unit 230, and the shunt unit 240 to operate in the reverse-bias state. The bias supplying unit 250 may supply a predetermined magnitude of a voltage to a source terminal and a drain terminal in order to increase the linearity of transistors being in the turned-off state. To this end, the bias supplying unit 250 may include at least one voltage source.

Figure 3A:
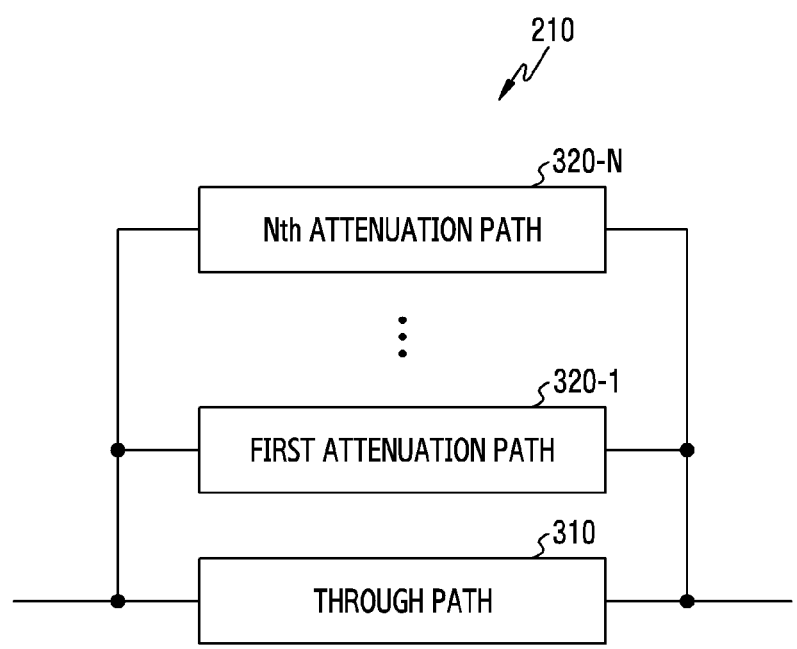
FIG. 3A illustrates a diagram of a configuration of a path unit of a gain control circuit according to various embodiments.

FIG. 3A illustrates a diagram of a configuration of a path unit of a gain control circuit according to various embodiments. Referring to FIG. 3A, the path unit 210 may include a through path 310 and a plurality of attenuation paths 320-1 to 320-N.

The through path 310 is a path through which a signal flows when the variation of a gain is the minimum. The through path 310 may form an impedance value which is smaller than that of each of the plurality of attenuation paths 320-1 to 320-N. The plurality of attenuation paths 320-1 to 320-N are paths for providing different gain variations and may form different impedance values.

The impedance value in each of the through path 310 and the plurality of attenuation paths 320-1 to 320-N may be formed using the on-resistance of a transistor. Therefore, each of the through path 310 and the plurality of attenuation paths 320-1 to 320-N may include a set of transistors of which the number and the size are different from each other. The through path 310 and the plurality of attenuation paths 320-1 to 320-N may be implemented as shown in FIG. 3B.

Figure 3B:
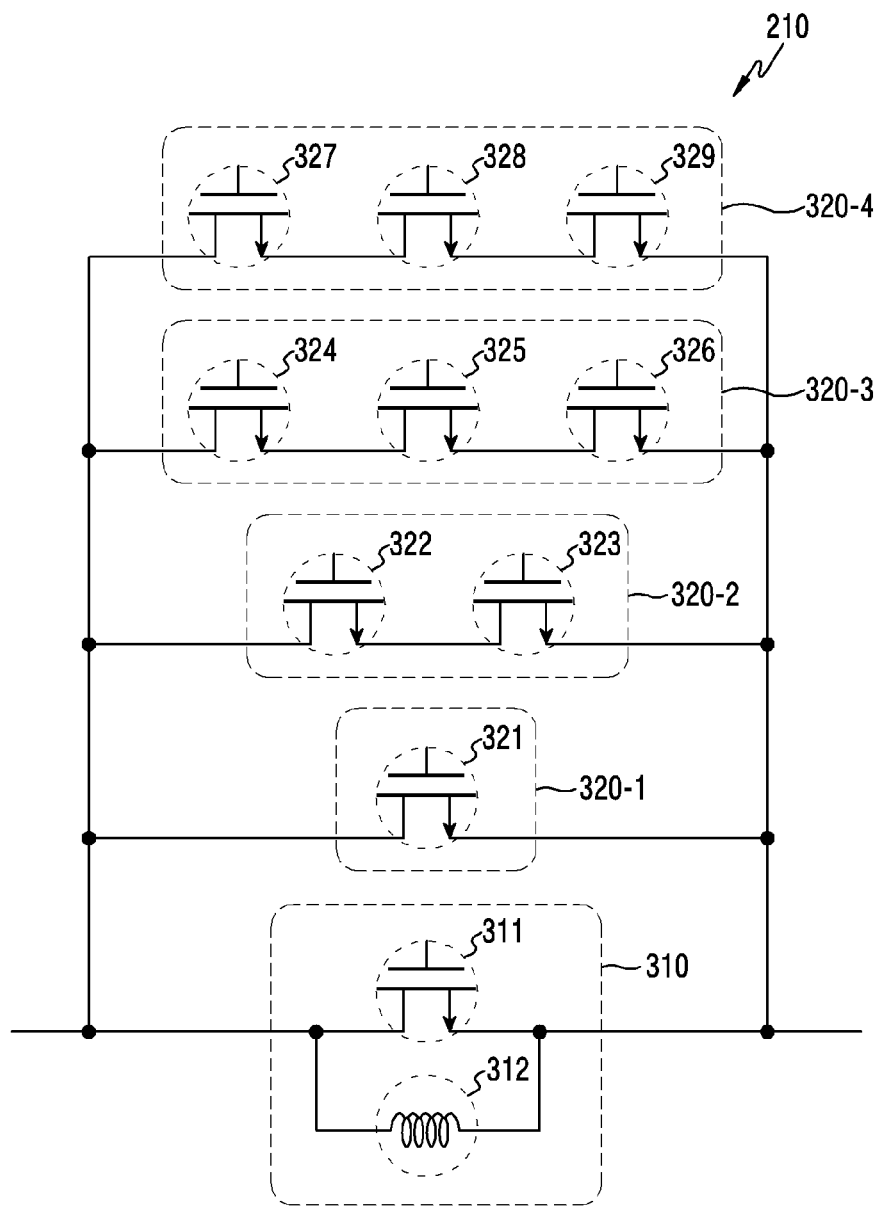
FIG. 3B illustrates a diagram of an example of implementation of a path unit of a gain control circuit according to various embodiments.

FIG. 3B illustrates a diagram of an example of implementation of a path unit of a gain control circuit according to various embodiments. The path unit 210 may be implemented as shown in FIG. 3B. In this instance, the example of implementation of FIG. 3B does not limit the disclosure, and the path unit 210 may be implemented differently. FIG. 3B illustrates the case in which one through path and four attenuation paths are implemented.

Referring to FIG. 3B, the through path 310 may include a transistor 311 and an inductor 312. The transistor 311 may be used as a switch, and the on-resistance of the transistor 311 and the inductance of the inductor 312 may form the impedance of the through path 310. One end of the inductor 312 is connected to the drain terminal of the transistor 311 and the other end of the inductor 312 is connected to the source terminal of the transistor 311. On/off of the transistor 311, as a switch, may be controlled on the basis of a control signal provided to a gate terminal.

The first attenuation path 320-1 may form an impedance value which is greater than that of the through path 310, and less than those of a second attenuation path 320-2, a third attenuation path 320-3, and a fourth attenuation path 320-4. The first attenuation path 320-1 may include a transistor 321. The on-resistance value of the transistor 321 may be greater than the on-resistance of the transistor 311. To this end, the transistor 321 may have a smaller width or a longer length than that of the transistor 311.

The second attenuation path 320-2 may form an impedance value which is greater than those of the through path 310 and the first attenuation path 320-1, and less than those of the third attenuation path 320-3 and the fourth attenuation path 320-4. The second attenuation path 320-2 may include a transistor 322 and a transistor 323 which are connected (stacked) in a stack structure. The sum of the on-resistance values of the transistor 322 and the transistor 323 may be greater than the on-resistance value of the transistor 321.

The third attenuation path 320-3 may form an impedance value which is greater than those of the through path 310, the first attenuation path 320-1, and the second attenuation path 320-2, and less than that of the fourth attenuation path 320-4. The third attenuation path 320-3 may include a transistor 324, a transistor 325, and a transistor 326 which are connected in a stack structure. The sum of the on-resistance values of the transistor 324, the transistor 325, and the transistor 326 may be greater than the sum of on-resistance values of the transistor 322 and the transistor 323.

The fourth attenuation path 320-4 may form an impedance value which is greater than those of the through path 310, the first attenuation path 320-1, the second attenuation path 320-2, and third attenuation path 320-3. The fourth attenuation path 320-4 may include a transistor 327, a transistor 328, and a transistor 329. The sum of the on-resistance values of the transistor 327, the transistor 328, and the transistor 329 may be greater than the sum of on-resistance values of the transistor 324, the transistor 325, and the transistor 326.

In the structure as shown in FIG. 3B, transistors included in the same path may be controlled to be equally turned on/off. If one of the plurality of paths 310, 320-1, 320-2, 320-3, and 320-4 is turned on, and the remaining paths are turned off, a signal flows in a single path being in the turned-on state, and the gain of the signal may be attenuated according to an impedance value formed in the corresponding path. The state in which the through path 310 is turned on is referred to as a "through mode", and the state in which one of attenuation paths 320-1, 320-2, 320-3, and 320-4 is turned on is referred to as an "attenuation mode". For example, in order to apply the minimum gain variation, that is, in the case of the through mode, the transistor 311 in the through path 310 is turned on and the attenuation paths 320-1 to 320-4 are turned off. In order to turn off the attenuation paths 320-1 to 320-4, the transistor 321 in the first attenuation path 320-1 may be turned off, at least one, or all, of the transistors 322 and 323 in the second attenuation path 320-2 may be turned off, at least one, or all, of the transistors 324 and 326 in the third attenuation path 320-3 may be turned off, and at least one, or all, of the transistors 327 and 329 in the fourth attenuation path 320-4 may be turned off.

According to an embodiment, the path unit 210 may be implemented as shown in FIG. 3B. In the example of FIG. 3B, the through path 310 may include a single transistor and a single inductor. According to another embodiment, the through path 310 may be implemented as shown in FIG. 4A, 4B, or 4C.

Figure 4A:
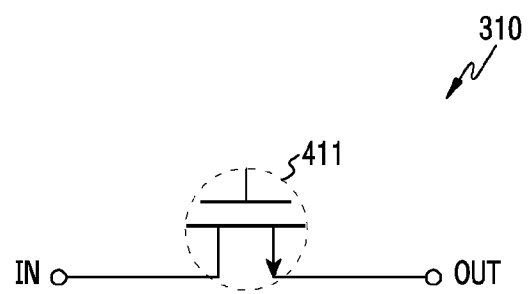
FIG. 4A illustrates a diagram of an example of implementation of a through path of a gain control circuit according to various embodiments.

FIG. 4A illustrates a diagram of an example of implementation of a through path of a gain control circuit according to various embodiments. FIG. 4B illustrates a diagram of an example of implementation of a through path of a gain control circuit according to various embodiments. FIG. 4C illustrates a diagram of an example of implementation of a through path of a gain control circuit according to various embodiments. The through path 310 may be implemented as shown in FIG. 4A, 4B, or 4C. In this instance, examples of implementation of FIG. 4A, 4B, or 4C may not limit the disclosure, and the through path 310 may be implemented differently.

According to an embodiment, as shown in FIG. 4A, the through path 310 may be configured with a transistor 411.

Figure 4B:
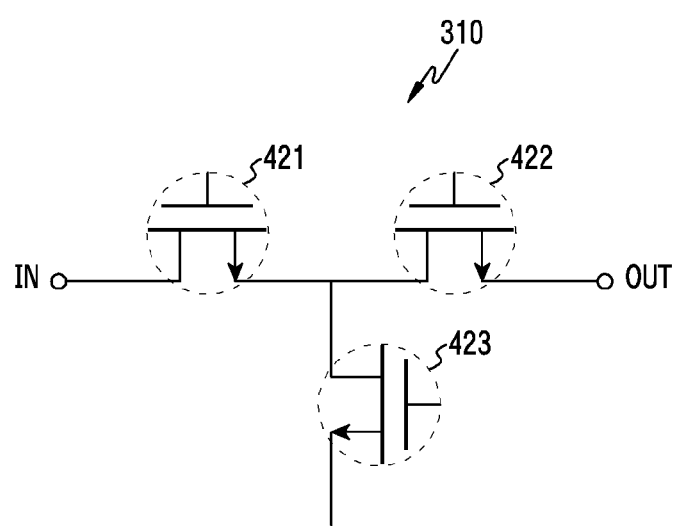
FIG. 4B illustrates a diagram of an example of implementation of a through path of a gain control circuit according to various embodiments.
Figure 4C:
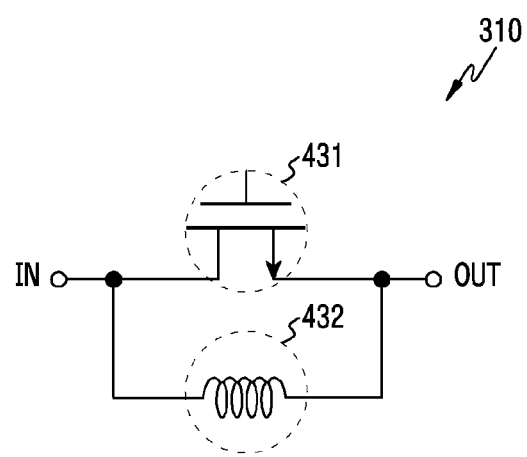
FIG. 4C illustrates a diagram of an example of implementation of a through path of a gain control circuit according to various embodiments.

According to another embodiment, as illustrated in FIG. 4B, the through path 310 may be configured with two transistors 421 and 422 connected in the stack structure, and with a transistor 423, which is connected to a node for connecting the two transistors 421 and 422, via a drain terminal.

According to another embodiment, as shown in FIG. 4C, the through path 310 may be configured with a transistor 431 and an inductor 432 connected in parallel. Here, the inductor 432 may be used to cancel a parasitic capacitance incurred by the transistor 431.

Depending on the structure of the through path 310 which may be implemented as shown in FIG. 4A, 4B, or 4C, the minimum attenuation and the maximum attenuation of the gain control circuit 110 may be different. For example, as the width of a transistor included in the through path 310 is wider, the minimum attenuation is lower. As the width of the transistor is narrower, the maximum attenuation is higher of two examples of implementation as shown in FIGS. 4A and 4B. As the width of the transistor is narrower, the maximum attenuation is lower of example of implementation as shown in FIG. 4C. The minimum attenuation of the three examples of implementation as shown in FIGS. 4A, 4B, and 4C are as shown in FIG. 5A, and the maximum attenuation thereof are as shown in FIG. 5B.

Figure 5A:
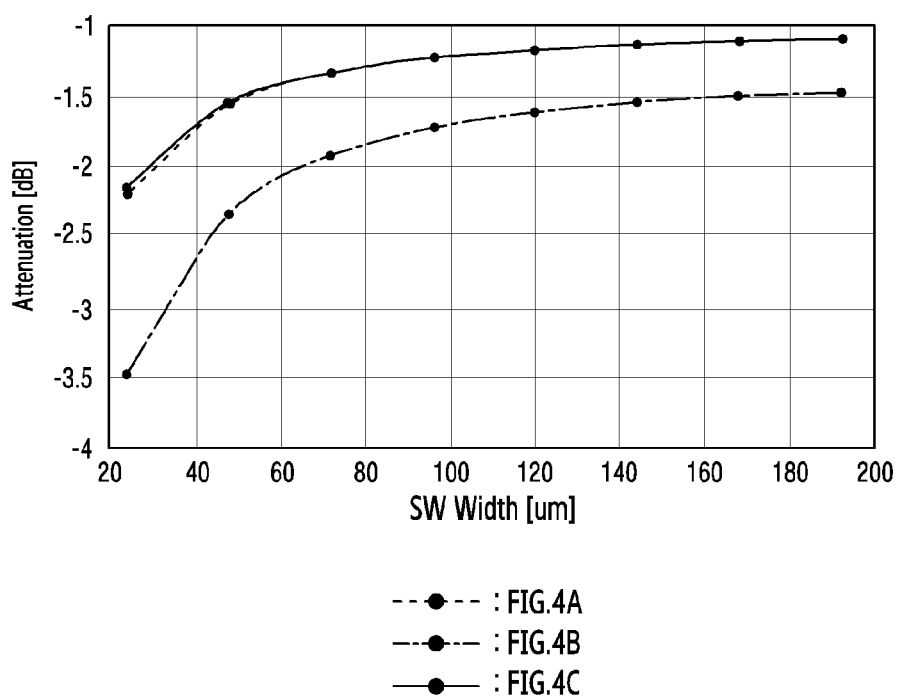
FIG. 5A illustrates a graph for comparison of performance of examples of implementation of a through path of a gain control circuit according to various embodiments.
Figure 5B:
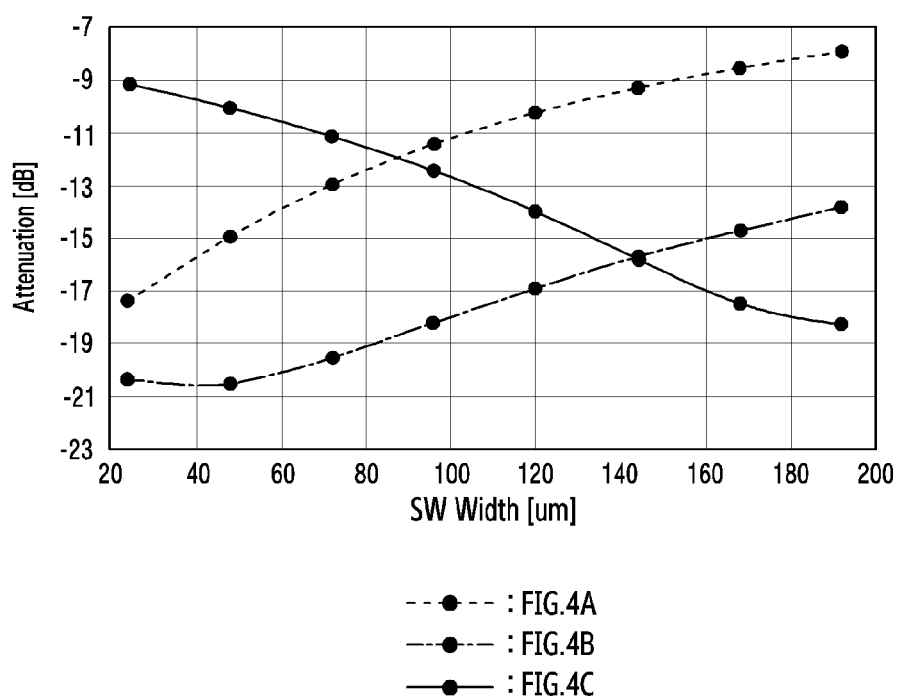
FIG. 5B illustrates a graph for comparison of performance of examples of implementation of a through path of a gain control circuit according to various embodiments.

FIG. 5A illustrates a graph for comparison of performance of examples of implementation of a through path of a gain control circuit according to various embodiments. FIG. 5B illustrates a graph for comparison of performance of examples of implementation of a through path of a gain control circuit according to various embodiments. FIGS. 5A and 5B relate to the three examples of implementation. FIG. 5A illustrates the minimum attenuation according to the width of a transistor. FIG. 5B illustrates the maximum attenuation according to the width of a transistor. Referring to FIG. 5A, the implementation of FIG. 4C may provide the lowest minimum attenuation. Also, referring to FIG. 5B, the implementation of FIG. 4C may provide the highest maximum attenuation within a predetermined width (e.g., 192 um). Therefore, it is understood that the implementation of FIG. 4C may show the best performance. However, depending on the purpose of implementation, the through path 310 may be implemented as shown in FIG. 4A, FIG. 4B, or FIG. 4C, or may be implemented in another structure.

Figure 6A:
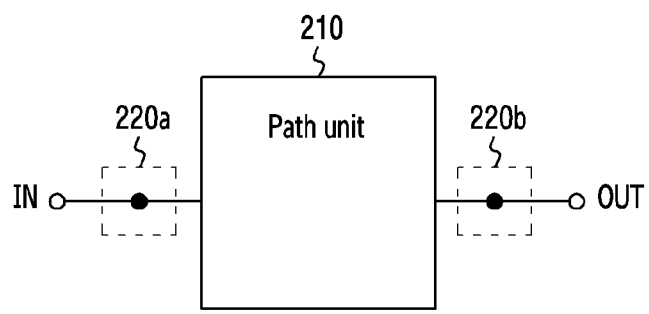
FIG. 6A illustrates a diagram of an example of implementation of an input matching unit and an output matching unit of a gain control circuit according to various embodiments.
Figure 6B:
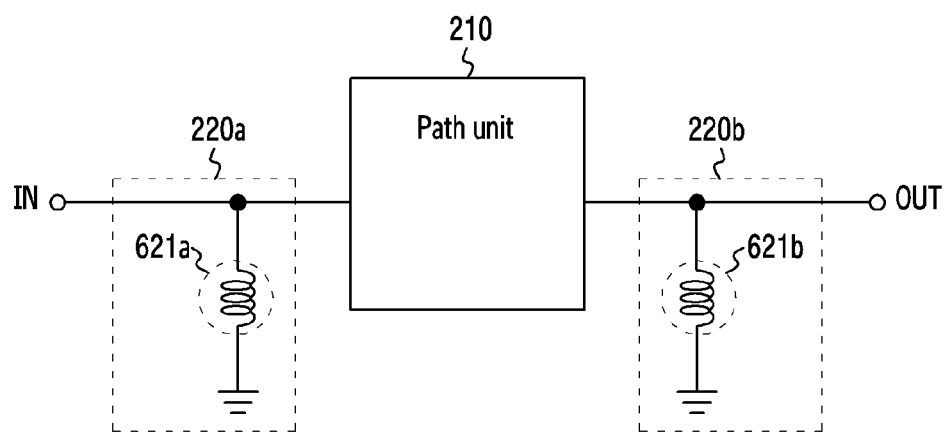
FIG. 6B illustrates a diagram of an example of implementation of an input matching unit and an output matching unit of a gain control circuit according to various embodiments.
Figure 6C:
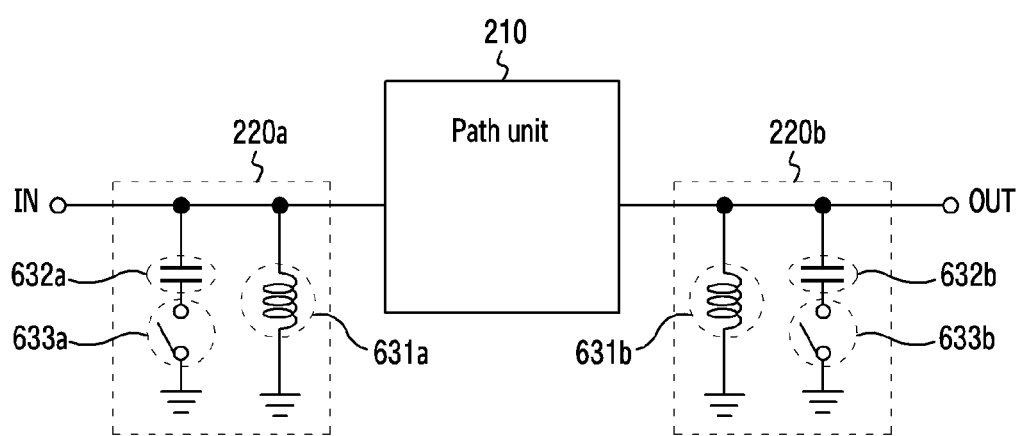
FIG. 6C illustrates a diagram of an example of implementation of an input matching unit and an output matching unit of a gain control circuit according to various embodiments.

FIG. 6A illustrates a diagram of an example of implementation of an input matching unit and an output matching unit of a gain control circuit according to various embodiments. FIG. 6B illustrates a diagram of an example of implementation of an input matching unit and an output matching unit of a gain control circuit according to various embodiments. FIG. 6C is a diagram illustrating an example of implementation of an input matching unit and an output matching unit of a gain control circuit according to various embodiments. The input matching unit 220a and the output matching unit 220b may be implemented as shown in FIG. 6A, FIG. 6B, or FIG. 6C. In this instance, examples of implementation of FIG. 6A, 6B, or 6C may not limit the disclosure, and the input matching unit 220a and the output matching unit 220b may be implemented differently.

According to an embodiment, the input matching unit 220a and the output matching unit 220b may be omitted as shown in FIG. 6A.

According to another embodiment, as shown in FIG. 6B, the input matching unit 220a and the output matching unit 220b may be configured with an inductor 621a or an inductor 621b connected in parallel. Referring to FIG. 6B, one end of the input matching unit 220a is connected to the input end of the path unit 210, and the other end includes the grounded inductor 621a. One end of the output matching unit 220b is connected to the input end of the path unit 210 and the other end includes the grounded inductor 621b. The inductors 621a and 621b may be used for performing compensation association with a parasitic capacitance incurred by the transistors included in the path unit 210.

According to another embodiment, as shown in FIG. 6C, the input matching unit 220a and the output matching unit 220b may be configured with an inductor 631a or 631b connected in parallel, a capacitor 632a or 632b connected in parallel, and a switch 633a or 633b connected with the capacitor 632a or 632b. The inductors 631a and 631b may be used for performing compensation association with a parasitic capacitance incurred by the transistors included in the path unit 210. The capacitors 632a and 632b may be used for compensating for a difference in parasitic capacitance between the on-state and the off-state of the through path 310. Accordingly, the switches 633a and 633b may be controlled according to the on/off state of the through path 310. For example, the switches may be closed when the through path 310 is turned on, and may be opened when the through path 310 is turned off.

Depending on the structures of the input matching unit 220a and the output matching unit 220b which may be implemented as shown in FIG. 6A, FIG. 6B, or FIG. 6C, an input impedance and an output impedance may be different. The input/output impedance values according to the implementation of FIG. 6A, FIG. 6B and FIG. 6C may be plotted on a Smith chart as shown in FIGS. 7A to 7C.

Figure 7A:
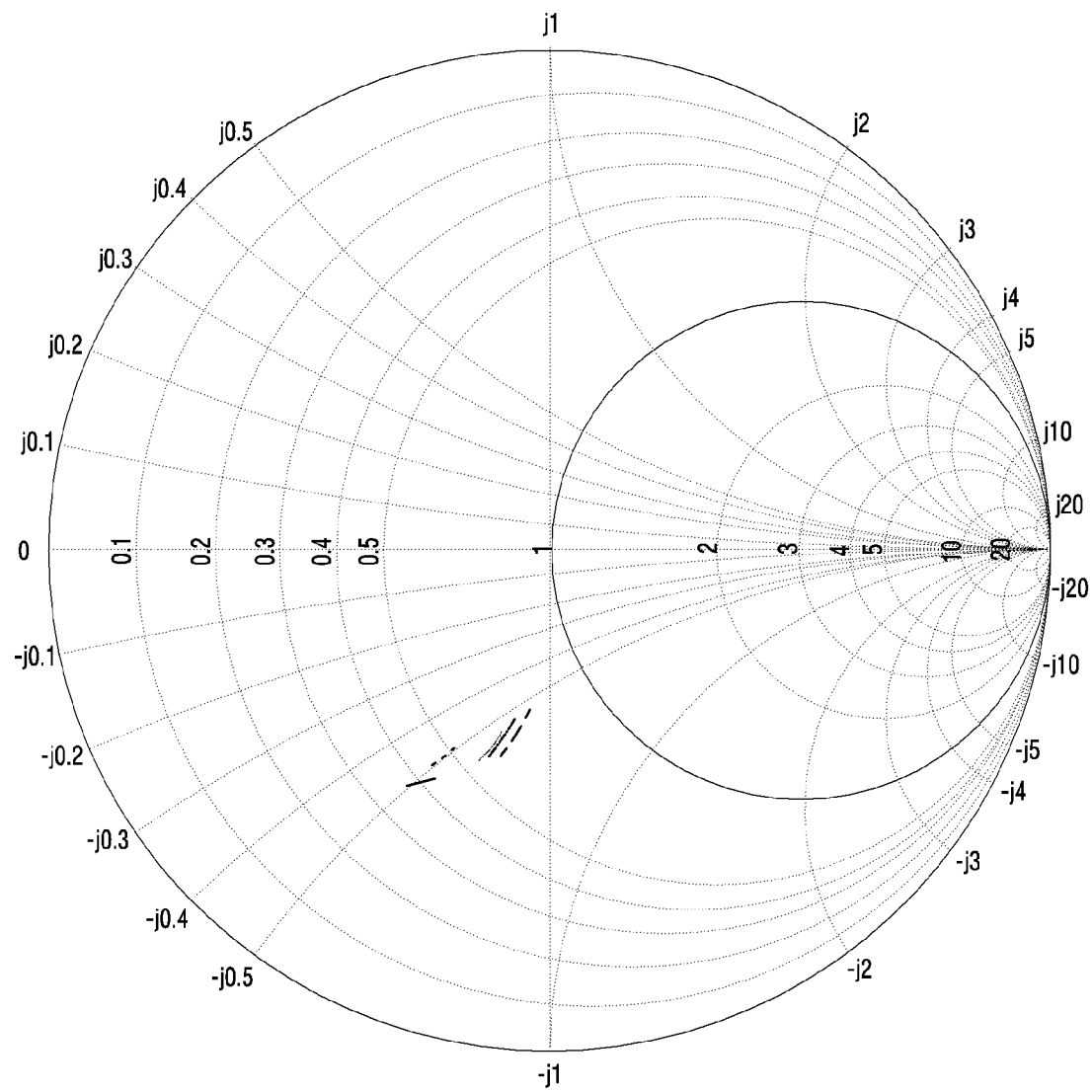
FIG. 7A illustrates a diagram of characteristics of an example of implementation of an input matching unit and an output matching unit of a gain control circuit according to various embodiments.
Figure 7B:
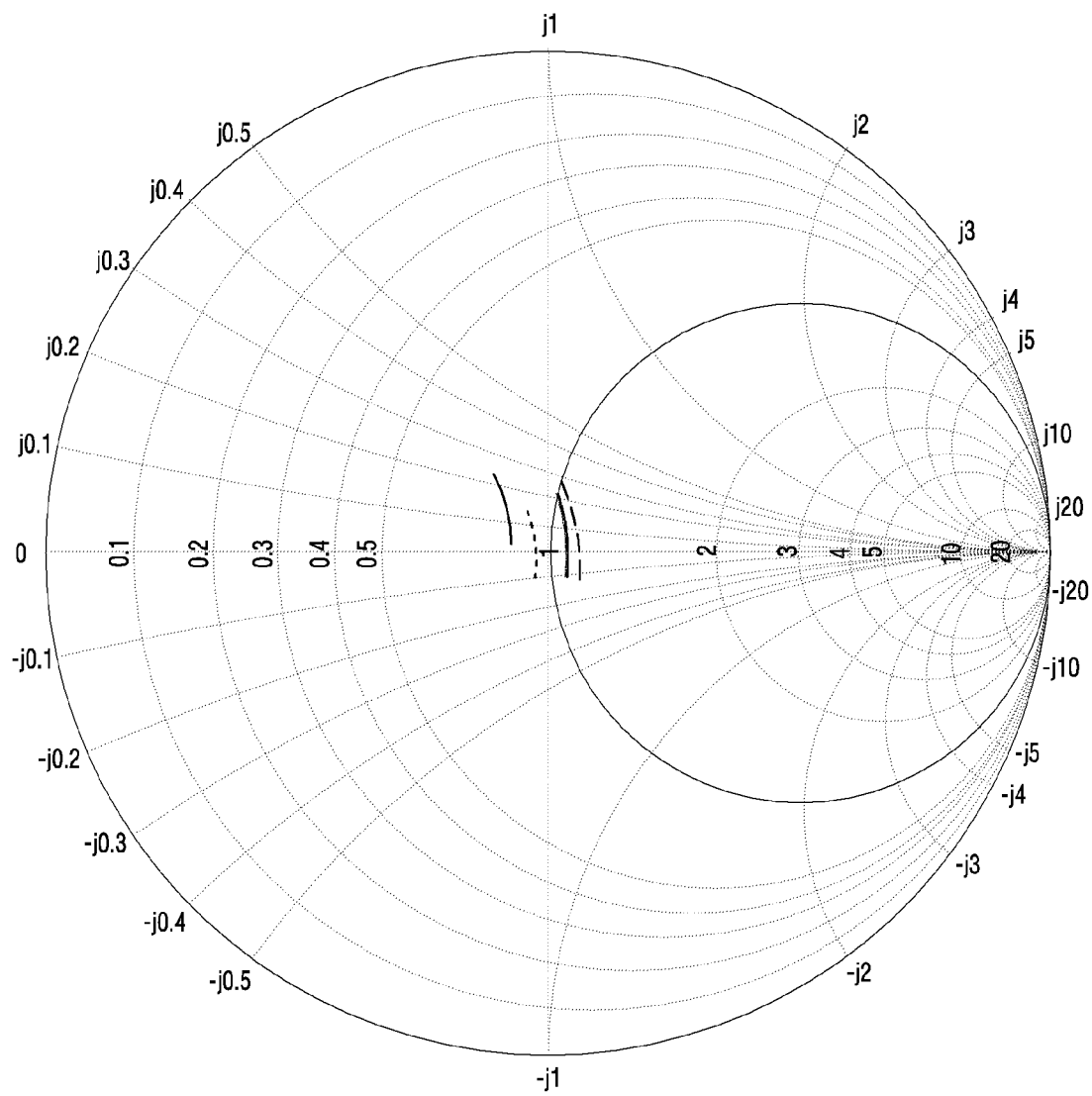
FIG. 7B illustrates a diagram of characteristics of an example of implementation of an input matching unit and an output matching unit of a gain control circuit according to various embodiments.
Figure 7C:
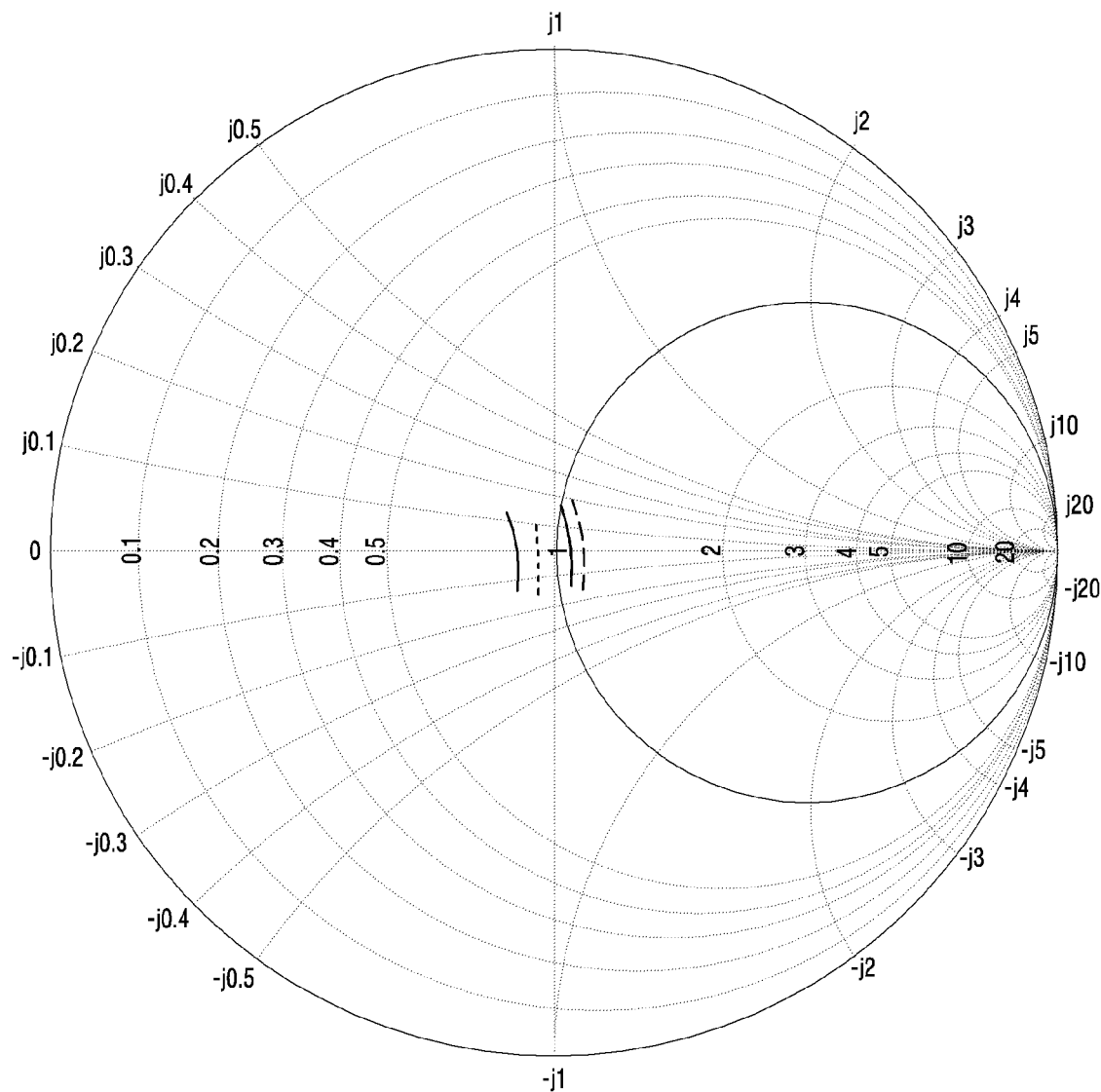
FIG. 7C illustrates a diagram of characteristics of an example of implementation of an input matching unit and an output matching unit of a gain control circuit according to various embodiments.

FIG. 7A illustrates a diagram of the characteristic of an example of implementation of an input matching unit and an output matching unit of a gain control circuit according to various embodiments. FIG. 7B illustrates a diagram of the characteristic of an example of implementation of an input matching unit and an output matching unit of a gain control circuit according to various embodiments. FIG. 7C illustrates a diagram of the characteristic of an example of implementation of an input matching unit and an output matching unit of a gain control circuit according to various embodiments. FIGS. 7A to 7C express input/output impedance values when one of the five paths of the path unit 210 is used. FIG. 7A is an example of the input matching unit 220a and the output matching unit 220b implemented as shown in FIG. 6A. FIG. 7B is an example of the input matching unit 220a and the output matching unit 220b implemented as shown in FIG. 6B. FIG. 7C is an example of the input matching unit 220a and the output matching unit 220b implemented as shown in FIG. 6C. With reference to FIGS. 7A to 7C, implementation of FIG. 6B or FIG. 6C may provide an impedance value which is closer to 50Ω, when compared to the implementation of FIG. 6A.

Figure 8:
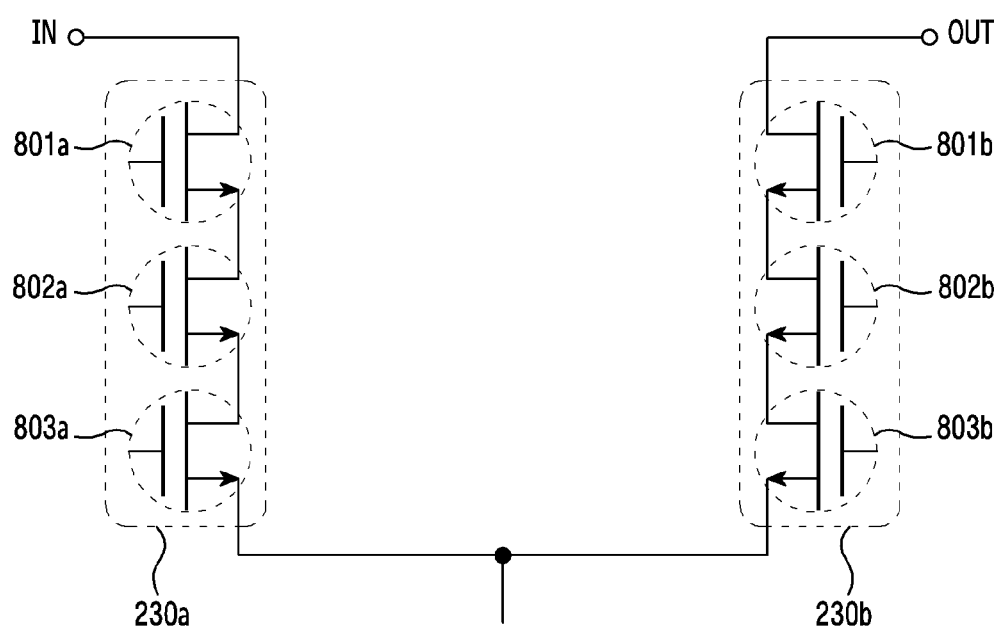
FIG. 8 illustrates a diagram of an example of implementation of an attenuation enabling unit of a gain control circuit according to various embodiments.

FIG. 8 illustrates a diagram of an example of implementation of an attenuation enabling unit of a gain control circuit according to various embodiments. The attenuation enabling unit 230 may be implemented as shown in FIG. 8. In this instance, the example of implementation of FIG. 8 does not limit the disclosure, and the attenuation enabling unit 230 may be implemented differently.

Referring to FIG. 8, the attenuation enabling unit 230 may have a structure in which a first part 230a and a second part 230b are connected in parallel. The first part 230a includes transistors 801a, 802a, and 803a connected in a stack structure, and the second part 230b includes transistors 801b, 802b, and 803b connected in a stack structure. If the gain control circuit 110 does not perform attenuation, that is, if the through path 310 is turned on, at least one, or all, of the transistors 801a, 802a, and 803a included in the first part 230a are turned off, and at least one, or all, of the transistors 801b, 802b, and 803b included in the second part 230b are turned off. Conversely, if the gain control circuit 110 performs attenuation, that is, if one of the attenuation paths 320-1 to 320-N is turned on, the transistors 801a, 802a, and 803a included in the first part 230a are turned on and the transistors 801b, 802b, and 803b included in the second part 230b are turned on.

Figure 9A:
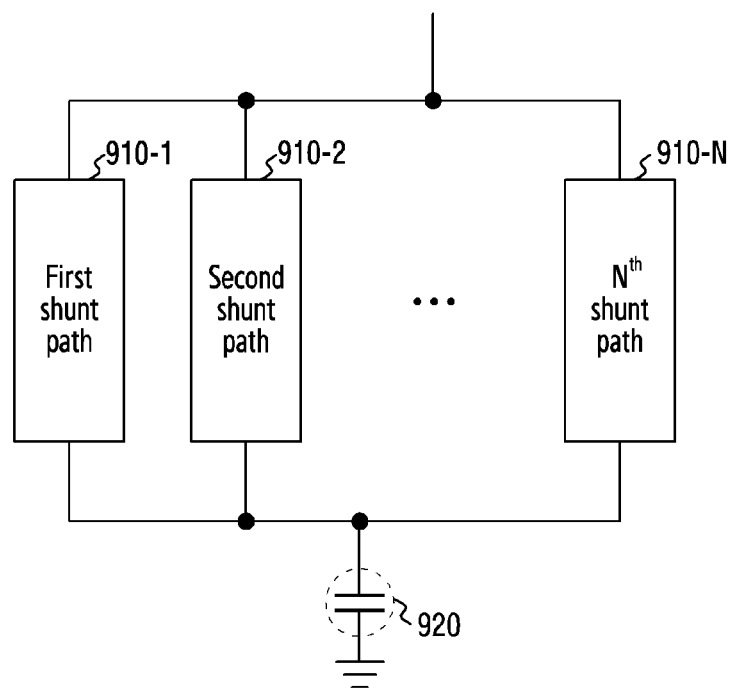
FIG. 9A illustrates a diagram of a configuration of a shunt unit of a gain control circuit according to various embodiments.

FIG. 9A illustrates a diagram of a configuration of a shunt unit of a gain control circuit according to various embodiments. Referring to FIG. 9A, the shunt unit 240 includes a plurality of shunt paths 910-1 to 910-N.

One ends of the plurality of shunt paths 910-1 to 910-N are grounded via a capacitor 920. The plurality of shunt paths 910-1 to 910-N may form different impedance values. In each of the plurality of shunt paths 910-1 to 910-N, an impedance value may be formed using the on-resistance of a transistor. The example of implementation of the plurality of shunt paths 910-1 to 910-N may be as shown in FIG. 9B.

Figure 9B:
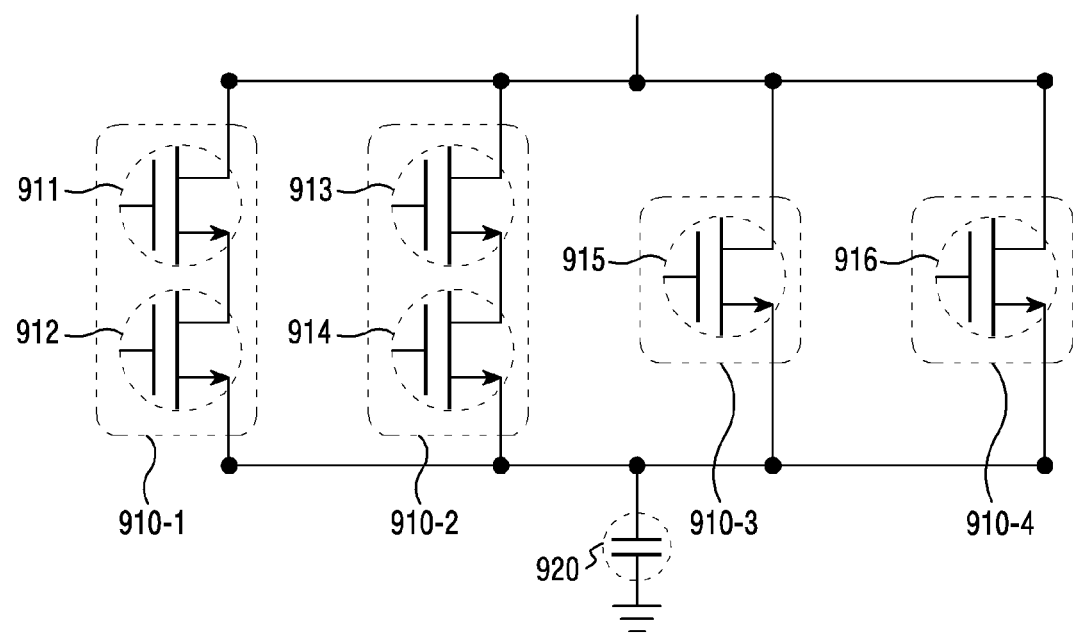
FIG. 9B illustrates a diagram of an example of implementation of a shunt unit of a gain control circuit according to various embodiments.

FIG. 9B illustrates a diagram of an example of implementation of a shunt unit of a gain control circuit according to various embodiments. The shunt unit 240 may be implemented as shown in FIG. 9B. In this instance, the example of implementation of FIG. 9B does not limit the disclosure, and the shunt unit 240 may be implemented differently. FIG. 9B illustrates the case in which four shunt paths are implemented.

Referring to FIG. 9B, the first shunt path 910-1 forms an impedance value greater than those of the second shunt path 910-2, the third shunt path 910-3, and the fourth shunt path 910-4. The first shunt path 910-1 may include a transistor 911 and a transistor 912 connected in a stack structure. The sum of on-resistance values of the transistor 911 and the transistor 912 may be greater than on-resistance values of other paths 910-2, 910-3, and 910-4.

The second shunt path 910-2 may form an impedance value less than that of the first shunt path 910-1, and greater than those of the third shunt path 910-3 and the fourth shunt path 910-4. The second shunt path 910-2 may include a transistor 913 and a transistor 914 connected in a stack structure. The sum of the on-resistance values of the transistor 913 and the transistor 914 may be less than the on-resistance values of the transistor 911 and the transistor 912.

The third shunt path 910-3 may form an impedance value less than those of the first shunt path 910-1 and the second shunt path 910-2, and greater than that of the fourth shunt path 910-4. The third shunt path 910-3 may include a transistor 915. The on-resistance value of the transistor 915 is less than the sum of on-resistance values of the transistor 913 and the transistor 914.

The fourth shunt path 910-4 may form an impedance value less than those of the first shunt path 910-1, the second shunt path 910-2, and the third shunt path 910-3. The fourth shunt path 910-4 may include a transistor 916. The on-resistance value of the transistor 916 may be less than the on-resistance value of the transistor 915.

In the structure as shown in FIG. 9B, transistors included in the same path may be controlled to be equally turned on/off. For example, in order to apply the minimum gain variation, that is, in the case of a through mode, at least one, or all, of the transistors 911 and 912 in the first shunt path 910-1 are turned off, at least one, or all, of the transistors 913 and 914 in the second shunt path 910-2 are turned off, the transistor 915 in the third shunt path 910-3 is turned off, and the transistor 916 in the fourth shunt path 910-4 is turned off. As another example, in the case of an attenuation mode, at least one of the first shunt path 910-1, the second shunt path 910-2, the third shunt path 910-3, and the fourth shunt path 910-4 is controlled to be the on-state.

As described in the various embodiments, an impedance for attenuating a signal gain may be formed using the on-resistance of a transistor. In this instance, a plurality of transistors connected in a stack structure may be used. If the plurality of transistors are connected in a stack structure, an impedance corresponding to the sum of the on-resistance of the plurality of transistors may be formed. If a single transistor having the constant on-resistance is used, the difference in voltage between the source terminal and the drain terminal may occur due to a decrease in gain. Accordingly, the corresponding transistor may operate abnormally and linearity may deteriorate. Therefore, as described in the embodiments, if a plurality of transistors are connected in a stack structure, and a transistor is turned on, the difference in voltage between the source terminal and the drain terminal of each transistor is relatively lower, and accordingly, linearity may be improved.

Similarly, if a transistor is turned off, reverse-bias is applied by the bias supplying unit 250, and linearity when the transistors is turned off may be improved. The example in which reverse bias is applied may be as shown in FIGS. 10A and 10B.

Figure 10A:
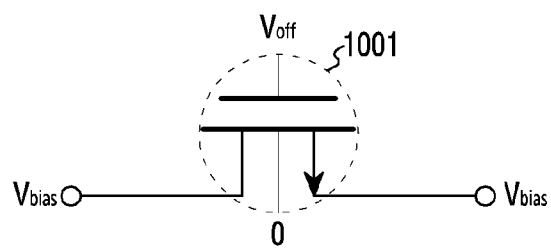
FIG. 10A illustrates a diagram of a reverse-bias state of a transistor, caused by a bias supplying unit in a gain control circuit according to various embodiments.
Figure 10B:
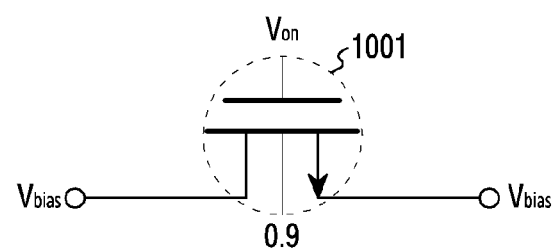
FIG. 10B illustrates a diagram of a reverse-bias state of a transistor, caused by a bias supplying unit in a gain control circuit according to various embodiments.

FIG. 10A illustrates a diagram of a reverse-bias state of a transistor, caused by a bias supplying unit in a gain control circuit according to various embodiments. FIG. 10B is a diagram illustrating a reverse-biased state of a transistor, caused by a bias supplying unit in a gain control circuit according to various embodiments. FIG. 10A illustrates that a transistor is in the off state, and FIG. 10B illustrates that a transistor is in the on state.

Referring to FIG. 10A, if $V_{off}$ (e.g.: 0V) is applied to the gate terminal of a transistor 1001, a transistor 1001 is turned off. Referring to FIG. 10B, if $V_{on}$ (e.g.: 1.8V) is applied to a gate terminal of the transistor 1001, the transistor 1001 is turned on. In this instance, $V_{bias}$ (e.g., 0.9V) is applied to the source terminal and the drain terminal by the bias supplying unit 250. Due to $V_{bias}$, $V_{GS}$ of the transistor 1001 is $-V_{bias}$, and the transistor 1001 operates in the reverse-bias state. Accordingly, $V_{on}$ needs to be increased by $V_{bias}$, when compared to the case in which $V_{bias}$ is 0. For example, if a gate voltage required for turning on the transistor 1001, which is not reverse-biased, is 0.9 V, a gate voltage required for turning on the transistor 1001 which is reverse biased with $V_{bias}$, increases to $0.9+V_{bias}$.

Figure 11:
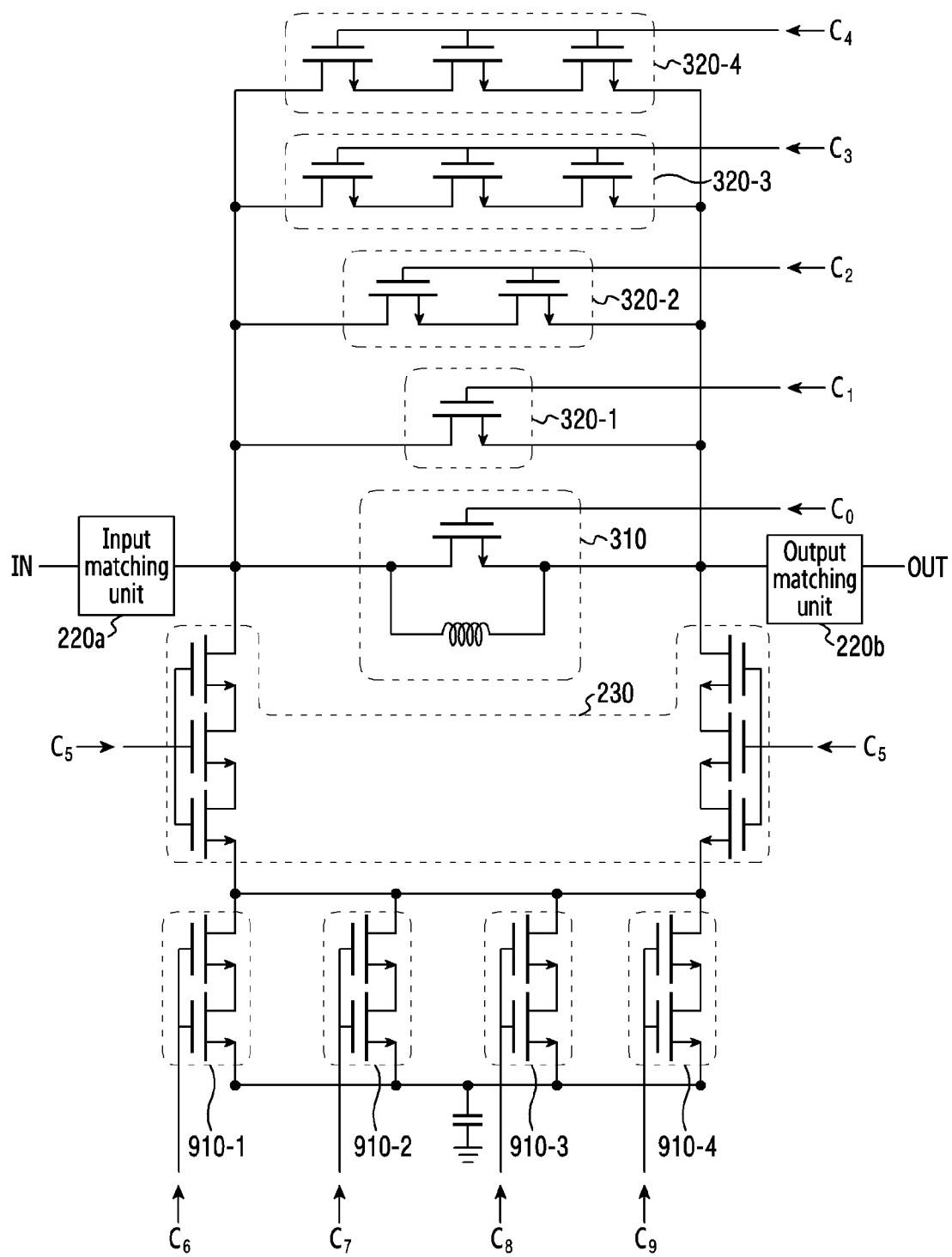
FIG. 11 illustrates a diagram of an example of implementation of a gain control circuit according to various embodiments.

FIG. 11 illustrates a diagram of an example of implementation of a gain control circuit according to various embodiments. FIG. 11 illustrates an example of implementation of the gain control circuit 110, and illustrates an example of a circuit in which the path unit 210, the attenuation enabling unit 230, and the shunt unit 240 implemented as shown in FIGS. 3B, 8, and 9B are combined. Referring to FIG. 11, each of a plurality of control signals $C_0$ to $C_9$ is provided to control a switching operation of at least one transistor. The set values of control signals $C_0$ to $C_9$ for gain modes defined according to the amount of attenuation are as shown in Table 1 below.

TABLE 1

| Gain mode | code | $C_0$ | $C_1$ | $C_2$ | $C_3$ | $C_4$ | $C_5$ | $C_6$ | $C_7$ | $C_8$ | $C_9$ |
|---|---|---|---|---|---|---|---|---|---|---|---|
| −2 | 000 | 1 | 0 | 0 | 0 | 0 | 0 | 0 | 0 | 0 | 0 |
| −5 | 001 | 0 | 1 | 0 | 0 | 0 | 1 | 1 | 0 | 0 | 0 |
| −8 | 010 | 0 | 0 | 1 | 0 | 0 | 1 | 0 | 1 | 0 | 0 |
| −11 | 011 | 0 | 0 | 0 | 1 | 0 | 1 | 0 | 0 | 1 | 0 |
| −14 | 100 | 0 | 0 | 0 | 0 | 1 | 1 | 0 | 0 | 0 | 1 |

According to Table 1, in a mode corresponding to code 100, $C_6$, $C_7$, and $C_8$ are set to 0. According to another embodiment, in a mode corresponding to code 100, at least one of $C_6$, $C_7$, and $C_8$ may be set to 1.

Figure 12A:
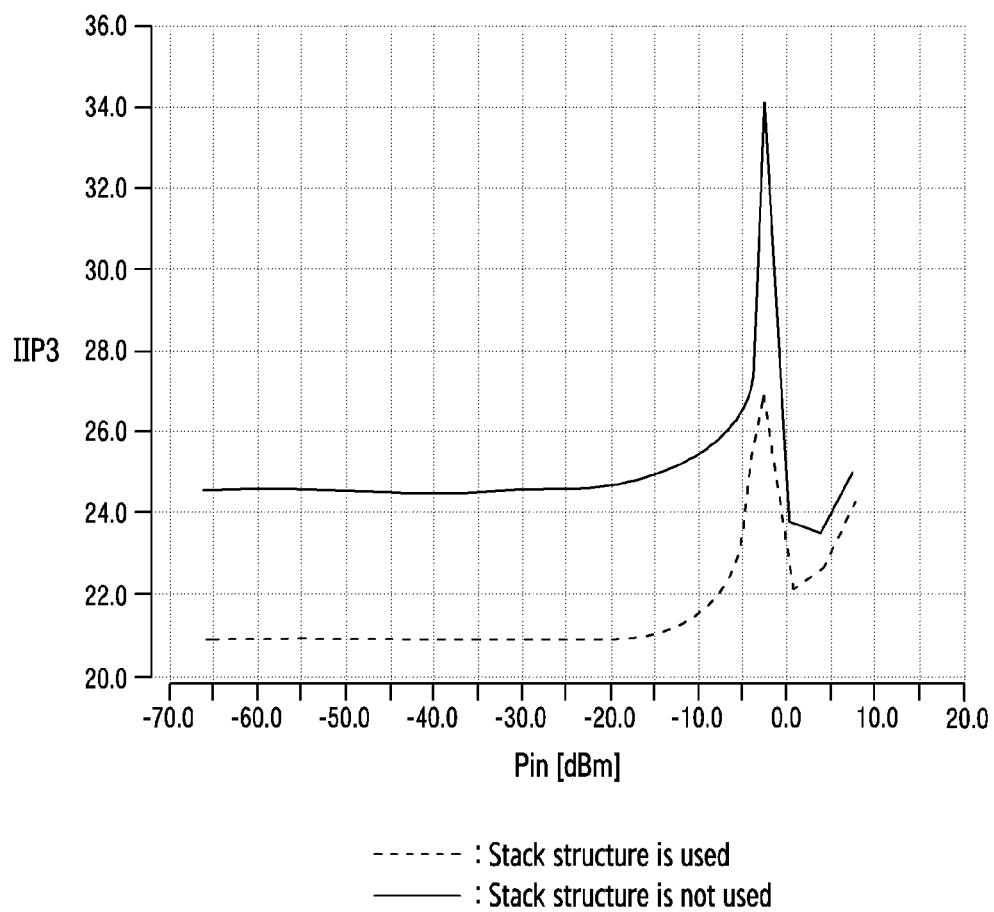
FIG. 12A illustrates a graph of performance of a gain control circuit according to various embodiments.
Figure 12B:
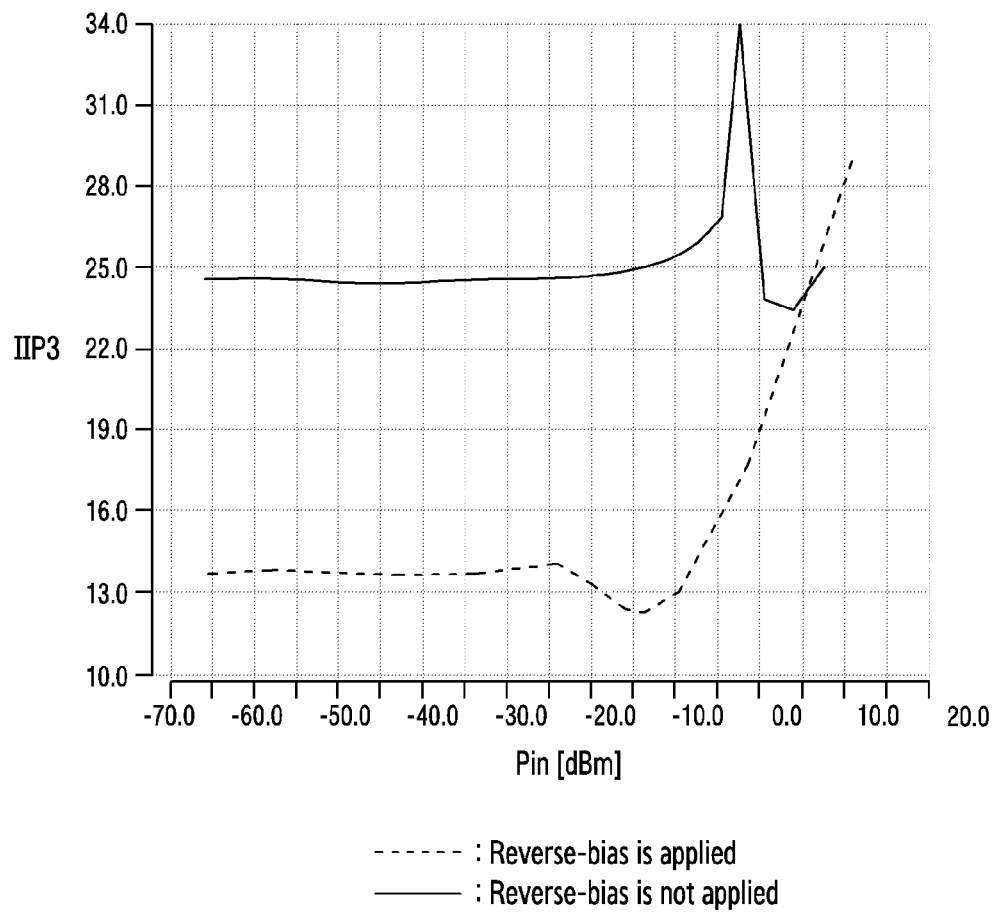
FIG. 12B illustrates a graph of performance of a gain control circuit according to various embodiments.

FIG. 12A illustrates a graph of performance of a gain control circuit according to various embodiments. FIG. 12B illustrates a graph of performance of a gain control circuit according to various embodiments. FIGS. 12A and 12B illustrate an input $3^{rd}$ order intercept (IIP3) according to a change in electric power of a signal input to the gain control circuit 110.

FIG. 12A compares the case in which at least one of the path unit 210, the attenuation enabling unit 230, and the shunt unit 240 is configured with transistors connected in a stack structure, and the case in which at least one of them is configured with a single transistor without using a stack structure. Referring to FIG. 12A, when the stack structure is used, it is identified that the IIP3 is relatively higher. For example, if the electric power of an input signal is −30 dBm, the IIP3 may be improved by approximately 4 dB.

FIG. 12B compares the case in which a reverse-bias is used and the case in which a reverse-bias is not used. Referring to FIG. 12B, when the reverse bias is used, it is identified that the IIP3 is relatively higher. For example, if the electric power of an input signal is −40 dBm, the IIP3 may be improved by approximately 11 dB.

Methods according to embodiments stated in claims and/or specifications of the disclosure may be implemented in hardware, software, or a combination of hardware and software.

When the methods are implemented by software, a computer-readable storage medium for storing one or more programs (software modules) may be provided. The one or more programs stored in the computer-readable storage medium may be configured for execution by one or more processors within the electronic device. The at least one program may include instructions that cause the electronic device to perform the methods according to various embodiments of the disclosure as defined by the appended claims and/or disclosed herein.

The programs (software modules or software) may be stored in non-volatile memories including a random access memory and a flash memory, a Read Only Memory (ROM), an Electrically Erasable Programmable Read Only Memory (EEPROM), a magnetic disc storage device, a Compact Disc-ROM (CD-ROM), Digital Versatile Discs (DVDs), or other type optical storage devices, or a magnetic cassette. Alternatively, any combination of some or all of the may form a memory in which the program is stored. Further, a plurality of such memories may be included in the electronic device.

In addition, the programs may be stored in an attachable storage device which is accessible through communication networks such as the Internet, Intranet, local area network (LAN), wide area network (WAN), and storage area network (SAN), or a combination thereof. Such a storage device may access the electronic device via an external port. Further, a separate storage device on the communication network may access a portable electronic device.

In the above-described detailed embodiments of the disclosure, a component included in the disclosure is expressed in the singular or the plural according to a presented detailed embodiment. However, the singular form or plural form is selected for convenience of description suitable for the presented situation, and various embodiments of the disclosure are not limited to a single element or multiple elements thereof. Further, either multiple elements expressed in the description may be configured into a single element or a single element in the description may be configured into multiple elements.

While the disclosure has been shown and described with reference to certain embodiments thereof, it will be understood by those skilled in the art that various changes in form and details may be made therein without departing from the scope of the disclosure. Therefore, the scope of the disclosure should not be defined as being limited to the embodiments but should be defined by the appended claims and equivalents thereof.

Although the present disclosure has been described with various embodiments, various changes and modifications may be suggested to one skilled in the art. It is intended that the present disclosure encompass such changes and modifications as fall within the scope of the appended claims.

What is claimed is:

1. An apparatus comprising:
   a path circuit configured to form a first impedance for controlling a gain applied to an input signal;
   a shunt circuit configured to form a second impedance for performing attenuation between the path circuit and a ground; and
   an attenuation enabling circuit configured to selectively connect a path between the path circuit and the shunt circuit,
   wherein the input signal is passed via the path circuit and the shunt circuit with an attenuation in case that the path is connected,
   wherein the input signal is passed via the path circuit without an attenuation performed by the shunt circuit in case that the path is opened,
   wherein the attenuation enabling circuit includes a structure in which a first part and a second part are connected to each other in parallel, and
   wherein the first part includes a first set of transistors connected in a stack structure, and the second part includes a second set of transistors connected in a stack structure.

2. The apparatus of claim 1, wherein a plurality of paths forms different impedance values, respectively, and comprises a set of transistors that operates as a switch.

3. The apparatus of claim 2, wherein:
   at least one first transistor that is included in a first path corresponding to a gain variation of the input signal is turned on, the first path being one of the plurality of paths; and
   at least one second transistor that is included in at least one second path is turned off, the at least one second path being at least one of the plurality of paths.

4. The apparatus of claim 2, wherein:
   the path circuit comprises a through path that provides a minimum gain variation; and
   the through path comprises a transistor and an inductor that are connected each other in parallel.

5. The apparatus of claim 2, wherein at least one path of the plurality of paths comprises a plurality of transistors connected to each other in a stack structure.

6. The apparatus of claim 1, further comprising:
   an input matching circuit including a first inductor configured to connect an input terminal of the path circuit to the ground; and,
   an output matching circuit including a second inductor configured to connect an output terminal of the path circuit to the ground,
   wherein the first inductor and the second inductor are configured to perform compensation associated with a parasitic capacitance of at least one transistor included in the path circuit.

7. The apparatus of claim 6, wherein the at least one transistor is configured to be in a reverse bias state.

8. The apparatus of claim 1, wherein the path circuit comprises a plurality of paths in parallel, and one of the plurality of paths provides a minimum gain variation.

9. The apparatus of claim 1, wherein the shunt circuit includes a plurality of shunt paths which form different impedance values, and
   wherein one end of the plurality of shunt paths is grounded via a capacitor.

* * * * *